Jan. 20, 1970 R. W. STIEGLER, JR 3,491,273

SEMICONDUCTOR DEVICES HAVING FIELD RELIEF ELECTRODE

Original Filed Aug. 20, 1964 5 Sheets-Sheet 1

INVENTOR
Roy W. Stiegler, Jr.

BY John G. Graham

ATTORNEY

SEMICONDUCTOR DEVICES HAVING FIELD RELIEF ELECTRODE

Original Filed Aug. 20. 1964 5 Sheets-Sheet 2

INVENTOR
Roy W. Stiegler, Jr.

BY

John G. Graham
ATTORNEY

SEMICONDUCTOR DEVICES HAVING FIELD RELIEF ELECTRODE

Original Filed Aug. 20. 1964

INVENTOR
Roy W. Stiegler, Jr.

BY
John G. Graham
ATTORNEY

Jan. 20, 1970 R. W. STIEGLER, JR 3,491,273

SEMICONDUCTOR DEVICES HAVING FIELD RELIEF ELECTRODE

Original Filed Aug. 20. 1964 5 Sheets-Sheet 4

INVENTOR
Roy W. Stiegler, Jr.

BY John G. Graham
ATTORNEY

INVENTOR
Roy W. Stiegler, Jr.

BY John G. Graham
ATTORNEY 3,491,273
SEMICONDUCTOR DEVICES HAVING FIELD RELIEF ELECTRODE Roy W. Stiegler, Jr., Dallas, Tex., assignor to Texas Instruments Incorporated, Dallas, Tex., a corporation of Delaware Continuation of application Ser. No. 390,831, Aug. 20, 1964. This application Oct. 25, 1967, Ser. No. 678,112
Int. Cl. H01l *11/04*
U.S. Cl. 317—235 5 Claims

ABSTRACT OF THE DISCLOSURE

Semiconductor devices with field relief electrodes provided by metal shields suspended over regions of the semiconductor body.

This application is a continuation of application Ser. No. 390,831, filed Aug. 20, 1964, now abandoned.

This invention relates to semiconductor devices, and more particularly to an electrode arrangement for avoiding the effects of surface inversion in semiconductor devices.

A problem long existing in semiconductor technology is the degradation of back biased p-n junctions in devices subjected to high operating temperatures. The major contributing factor to this degradation is surface inversion, a tendency for the semiconductor material at the surface to invert from one conductivity type to the opposite type. This effect is especially prevalent in p-type silicon having a silicon oxide layer thereon, the surface tending to invert to n-type. Also, since the collector-base of a transistor is heavily reverse biased, and the collector region of a transistor usually doped more lightly than the base and emitter, the detrimental effects of surface inversion are most noticeable in the collector-base characteristics of p-n-p silicon planar transistors. Inversion is reduced by doping the p-type collector region more heavily, but this limits the transistor to low collector-base breakdown voltages. A partial solution to the inversion problem is provided by employing high resistivity p-type material for the collector, then forming a heavily-doped p+ region near the wafer surface in the collector region surrounding but spaced from the base region. In this construction, the p+ region is referred to as a "guard ring," although in many cases the region is not ring-shaped or circular but instead is square or rectangular, but in any event is of closed configuration. The guard ring retards degradation due to surface inversion, but yet permits the collector region to be of high resistivity so that the back breakdown voltage can be high.

Although it has been found that the guard ring construction is quite effective on conventional transistors, its effectiveness is lost when metallic strips are placed over the silicon oxide layer which covers the surface of the device, this arrangement being necessary in integrated circuits for interconnections and in expanded contact transistors. The conductive strip, if biased heavily positive with respect to the underlying semiconductor material, enhances the inversion layer at the surface, producing a heavy concentration of electrons (n-type carriers) in the silicon just beneath the strip. Thus, in effect, an n+ region is formed, and where the n+ region adjoins the p+ guard ring region, a p+ to n+ junction results. Such a junction inherently exhibits a very low back breakdown, acting virtually as a short circuit.

Accordingly, it is the principal object of this invention to reduce the effects of surface inversion in semiconductor devices. A further object is to provide improved semiconductor devices of the type having contacts or interconnections in the form of conductive strips on the semiconductor surface insulated therefrom by an oxide layer. Another object is to provide an improved transistor or the like, particularly of the p-n-p variety, employing expanded contacts but relatively free of degradation at high temperatures due to surface inversion.

In accordance with this invention, the surface of a semiconductor device is shielded from an electric field in a critical region by means of a conductive electrode suspended over the region. This arrangement may be referred to as a field relief electrode. In a p-n-p planar transistor, the electrode may well take the form of an annular or closed metallic ring engaging the surface of a p+ guard ring and extending radially inwardly therefrom over the oxide layer to overlie at least part of the more lightly doped p-type collector material. Other embodiments employ the field relief electrode in different configurations as will appear hereinafter.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

FIGURES 4–8 are sectional views of the transistor of FIGURE 4 in successive stages of manufacture;

Figure 1:
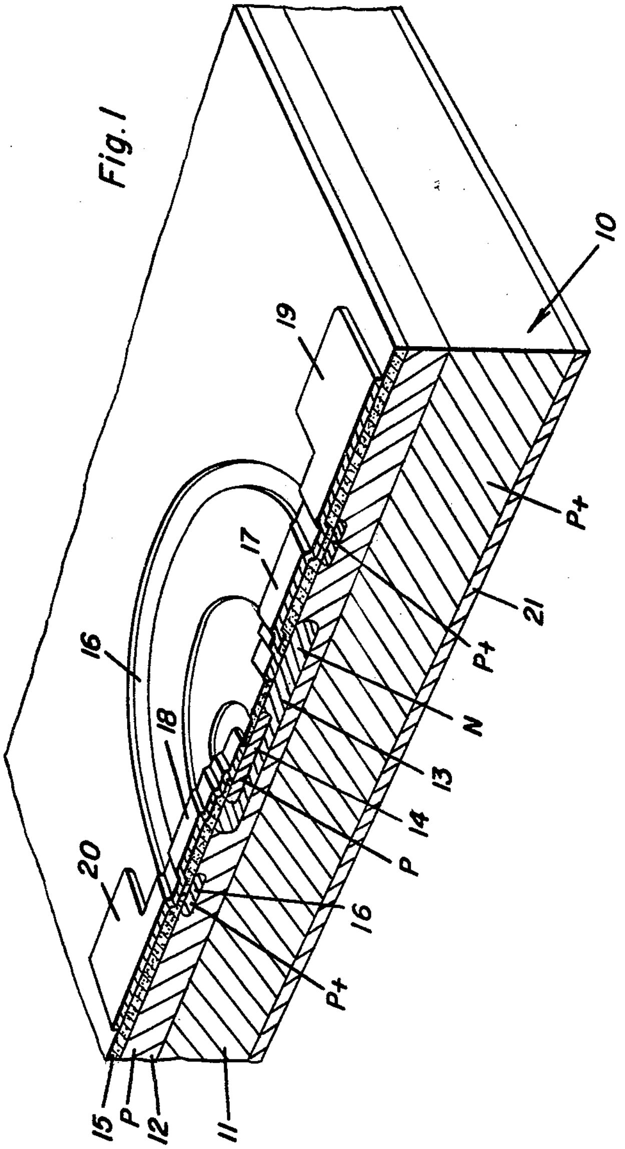
FIGURE 1 is a pictorial view in section of a transistor and is used herein for explaining the principles of the invention.

With reference to FIGURE 1, a p-n-p planar epitaxial transistor is shown which is of the type employing a guard ring to counteract the effects of surface inversion. This transistor includes a silicon wafer 10 having a heavily doped p-type substrate 11 and a lightly doped p-type epitaxial layer 12. An n-type base region 13 is formed in the central part of the epitaxial layer 12, and a small circular p-type emitter region 14 is formed in the base region in an off-set manner to provide room for a base contact. The base and emitter regions are usually created by successive diffusion operations using silicon oxide masking as set forth in U.S. Patent No. 3,122,817 to Jules Andrus. The silicon oxide formed for masking and during impurity deposition operations remains on the top surface of the wafer 10 as a silicon oxide coating 15 which is seen to be in a stepped configuration of differing thicknesses due to the successive removal of oxide to form the various regions. Various surface effects, including the presence of this oxide coating 15, tend to cause the subjacent surface of the p-type region 12 to invert to n-type, i.e., to form a thin surface-adjacent layer in the silicon, the layer containing an excess of free carriers in the form of electrons. Thus, in accordance with the teachings of patent application Ser. No. 141,708, now U.S. Patent No. 3,197,681, filed by G. R. Broussard on Sept. 29, 1961, and assigned to the assignee of the present application, a heavily doped p-type annular region 16 is formed in the top surface of the wafer. This region 16 may be formed at the same time as the emitter diffusion. The base and emitter contacts to this transistor are provided by metal strips 17 and 18 which extend into holes etched in the oxide coating 15 to make ohmic connection to the appropriate regions. The strips terminate in enlarged bonding pads 19 and 20. This expanded contact arrangement is necessary in high frequency devices because of the extreme small size of the active regions, the emitter being only a few hundredths of a square mil in area in some cases. If the contacts are no larger than the active regions in such cases, it is virtually impossible to bond lead wires thereto, and so the expanded contacts with enlarged bonding pads are needed. The transistor of FIGURE 1 is completed by securing the substrate 11 down to a metal electrode, such as a header, with contact metal 21 to provide the collector electrode, and then bonding lead wires from the pads 19 and 20 to suitable base and emitter electrodes.

Figure 2:
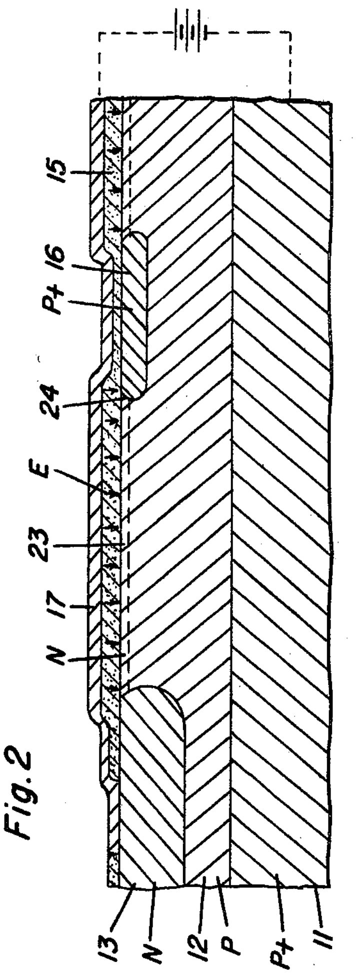
FIGURE 2 is an enlarged sectional view of a portion of the transistor of FIGURE 1.

In operation of the transistor of FIGURE 1, bias voltages are applied between the base and collector and between the emitter and collector, often at elevated temperatures. These factors result in breakdown or shorting of the device, rendering it useless except at low operating bias levels and/or low temperatures. This breakdown is caused by what occurs in the region closely adjacent the annular region 16, which will now be examined in detail. With reference to FIGURE 2, an enlarged view of a portion of FIGURE 1 beneath the expanded base contact 17, it will be noted that a shallow channel 23 is created beneath the oxide coating 15. This channel or inversion layer has a fairly high concentration of carriers, electrons in this case, and so may be considered to be n-type. Heavily doped p-type silicon is not as easily inverted to n-type, however, so the annular region 16 prevents failure because the channel 23 is not continuous from the base to collector. This structure is effective so long as expanded contacts are not used.

The metal strip 17 extending from the base 13 across portions of the collector region sets up an electric field E in the dielectric and at the silicon surface due to the collector-base bias.

This field increases the free carrier concentration in the channel 23, forming in effect an n+ region. The junction between the annular region 16 and the channel 23, particularly that portion 24 which is reverse biased, is now very easy to break down since it has a high carrier concentration on both sides. The adverse effects of the expanded contacts are made worse by the presence of heat, which not only tends to increase the inversion in the silicon surface, but also may create a permanent electric field in the dielectric due to the electret effect.

In accordance with the present invention, reverse breakdown due to the effects discussed above is prevented by shielding the critical area adjacent the annular region from the electric field. As will be seen in FIGURE 3, this shielding is accomplished by an additional electrode beneath the expanded leads.

Figure 3:
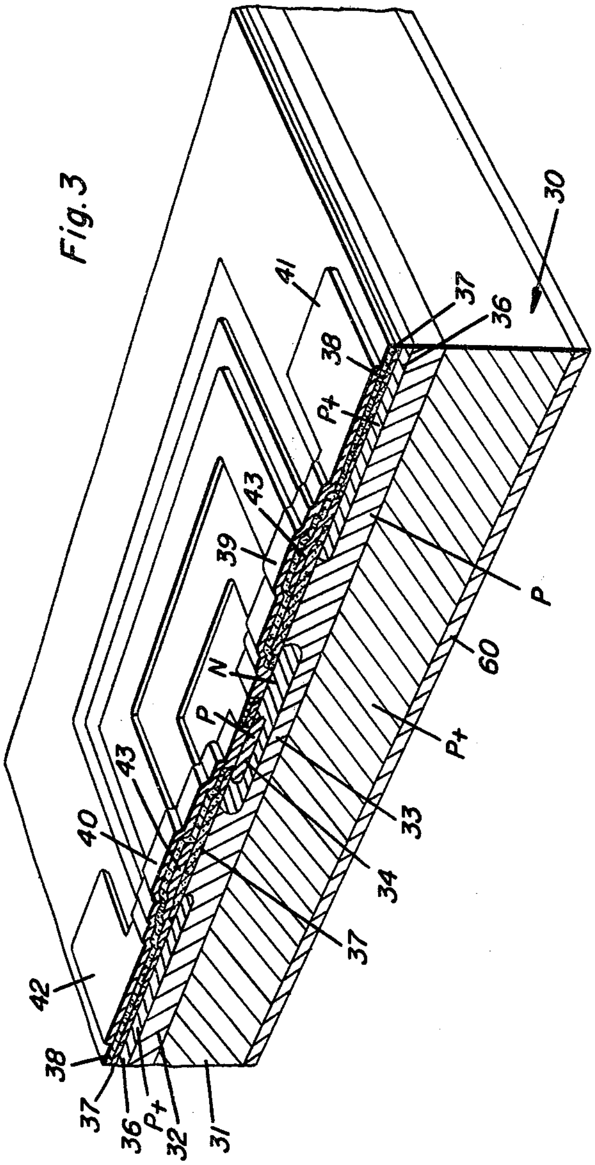
FIGURE 3 is a pictorial view in section of a transistor employing the field relief electrode of this invention.
Figure 4:
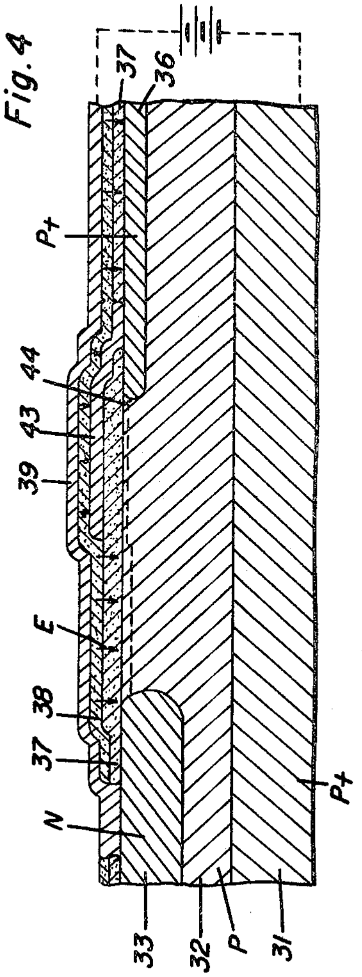
FIGURE 4 is an enlarged sectional view of a portion of the transistor of FIGURE 3.

FIGURE 3 shows a p-n-p epitaxial planar transistor similar to FIGURE 1 but using the field relief electrode of this invention. As above, the transistor comprises a silicon wafer 30 having a heavily-doped substrate 31 and a lightly doped p-type epitaxial layer 32. Formed in the epitaxial layer is a diffused n-type base region 33 and a diffused p-type emitter region 34. A heavily-doped p-type region 36 surrounds the base region at the top surface of the wafer to reduce the undesirable effects of surface inversion. Two different coatings of silicon oxide exist on the top surface of the wafer. The first of these is a coating 37 of thermal oxide which is used as a diffusion mask in forming the base, emitted and annular regions. This coating 37 is in a stepped configuration due to the several stages of oxide formation and removal and impurity deposition. In addition to the thermal oxide, a coating 38 of pyrolytically deposited silicon oxide is provided on the top surface of the wafer. This coating 38 serves to insulate the expanded contacts from the field relief electrode. Electrical connections to the base and emitter regions are provided by metal strips 39 and 40 which engage the silicon surface in holes etched through the oxide layers, then extend out over the oxide to bonding pads 41 and 42. Surrounding the inner edge of the heavily-doped region 36 is a field relief electrode 43 which is the principal feature of this invention. The electrode is ohmically connected at its outer periphery to the region 36 through an opening etched in the oxide layer 37, and from there extends inwardly over top of the thermal oxide coating 37. The electrode 43 is electrically insulated from the expanded leads 39 and 40 by the pyrolytically deposited oxide coating 38. As may best be seen in the enlarged view of FIGURE 4, the critical area 44 just inside the innermost part of the region 36 is shielded from the electric field E which results when the collector-base is reverse biased, i.e., when a positive voltage is applied between the strip 39 and the collector region 31, 32. While some inversion will occur due to the presence of silicon oxide, the effect of the electric field is eliminated. Accordingly, in combination with the advantages of the guard ring 36, the field relief electrode provides a marked improvement in breakdown voltage at elevated temperature.

Figure 5:
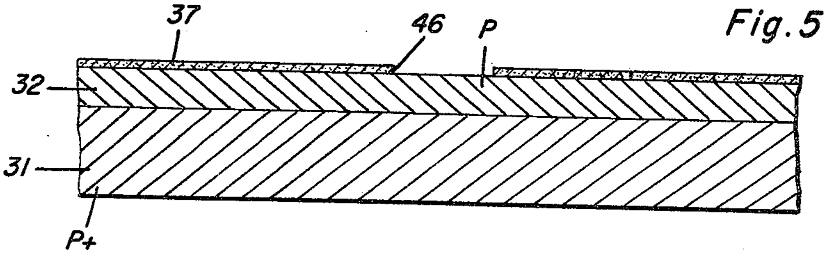
Figure 6:
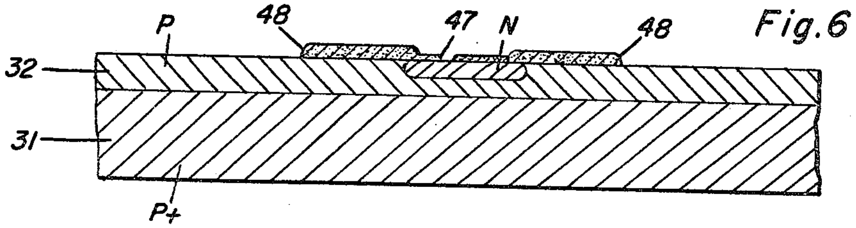
Figure 7:
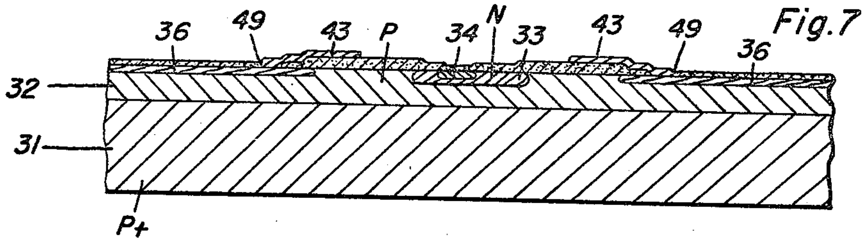
Figure 8:
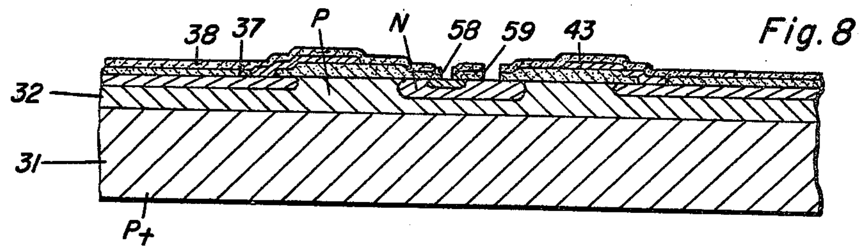
Figure 9:
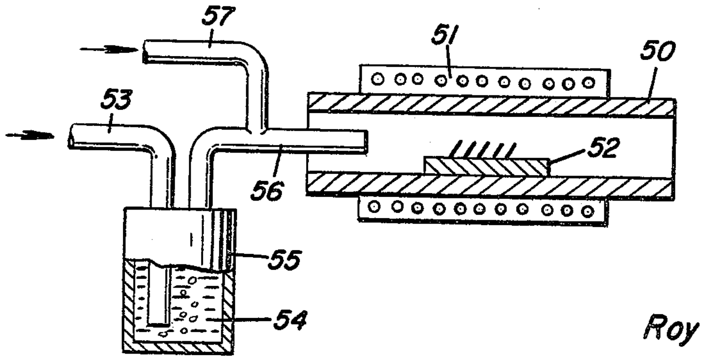
FIGURE 9 is a schematic representation, partly in section, of apparatus used in making the transistor of FIGURE 3.

A method of manufacturing the device of FIGURE 3 will now be described. With reference to FIGURE 5, the starting material is the substrate 31, a wafer perhaps thirty mils square, which is at this point merely an undivided segment of a large slice of monocrystalline p-type silicon about one inch in diameter and 10 mils thick. A layer 32 of higher resistivity p-type material is epitaxially grown upon the top surface of the substrate, then the initial oxide coating is formed over the epitaxial layer and an opening 46 made therein by photoresist masking and etching techniques. The slice including the wafer 30 is then subjected to an n-type diffusion operation whereupon a donor impurity such as phosphorus is diffused into the top of the epitaxial region 32 to form the base region 33, while at the same time silicon oxide reforms over the opening 46. Referring now to FIGURE 6, a smaller opening 47 is made in the regrown part of the oxide coating 37, and a peripheral opening 48 is also made, both of these being cut in the same photoresist masking and etching operation. The slice is then subjected to a p-type diffusion operation during which boron or other acceptor impurity is diffused into the top surface through the openings and oxide is reformed, creating the emitter region 34 and the peripheral guard ring region 36 as seen in FIGURE 7. The device is now ready for forming the field relief electrode thereon. To this end, a peripheral opening 49 is made in the oxide coating 37, and a film of conductive metal such as molybdenum or chromium is deposited over the entire top surface of the wafer or slice. In the opening 49 the metal adheres to the silicon surface and makes ohmic contact thereto. The metal used for this electrode must be fairly nonreactive with silicon or silicon oxide at the temperatures used in the subsequent oxide deposition. The metal film is removed in unwanted areas by a photoresist operation, leaving only the field relief electrode 43 surrounding the transistor base region on the top face of the wafer. Expanded contacts must now be made to the base and emitter regions, and since these must pass over the electrode 43 some provision must be made for insulation. Accordingly, the layer 38 of silicon oxide is applied, preferably by deposition at low temperature from a vapor of an oxysilane compound in the presence of oxygen. Apparatus for carrying out this preferred method of oxide deposition is illustrated in FIGURE 9, where a tube furnace 50 is shown having a heater 51 for maintaining the temperature therein at perhaps 500° C. A plurality of slices are placed in a boat 52 within the furnace, each slice of silicon containing many of the wafers 30 in undivided form. The reaction gases are introduced into the furnace by an arrangement including a conduit 53 through which oxygen is forced at about one cubic foot per minute. The gas bubbles through a quantity of liquid tetraethylorthosilicate 54 in a flask 55, where vapor of the oxysilane is entrained, then the gaseous mixture passes into the furnace through a conduit 56. Additional oxygen gas is introduced into the stream by a conduit 57 at a rate of about one cubic foot per minute. With this apparatus, the silicon oxide layer 38 can be deposited at a rate of 2000 A. per hour, with a thickness of about 4000 A. being adequate for insulation purposes. Following the deposition of the oxide coating 38, openings 58 and 59 are made in the oxide over the base and emitter regions to expose the silicon surface for the purpose of making ohmic connections to these regions of the transistor. A film of contact metal is then evaporated over the entire top surface in such a manner that the metal adheres and makes nonrectifying contact to the silicon surface in the openings 58 and 59. Thereafter, unwanted metal is removed to leave the desired contact and expanded lead pattern including the strips 39 and 40 and bonding pads 41 and 42 as seen in FIGURE 3. The slice of silicon with a large number of the devices of FIGURE 3 formed therein is now scribed and broken into individual wafers 30, which may then be mounted on transistor headers in accordance with standard practice. At this point a collector contact 60 is provided, the contact member representing either the solder used to secure the wafer to the header, a metal header itself, or a metallized area on a ceramic transistor package. Connections are then made to the base and emitter bonding pads 41 and 42 by small gold wires which extend to suitable posts or electrodes in the header, and the encapsulation is completed by securing a can or other closure to the header.

Figures 10, 11:
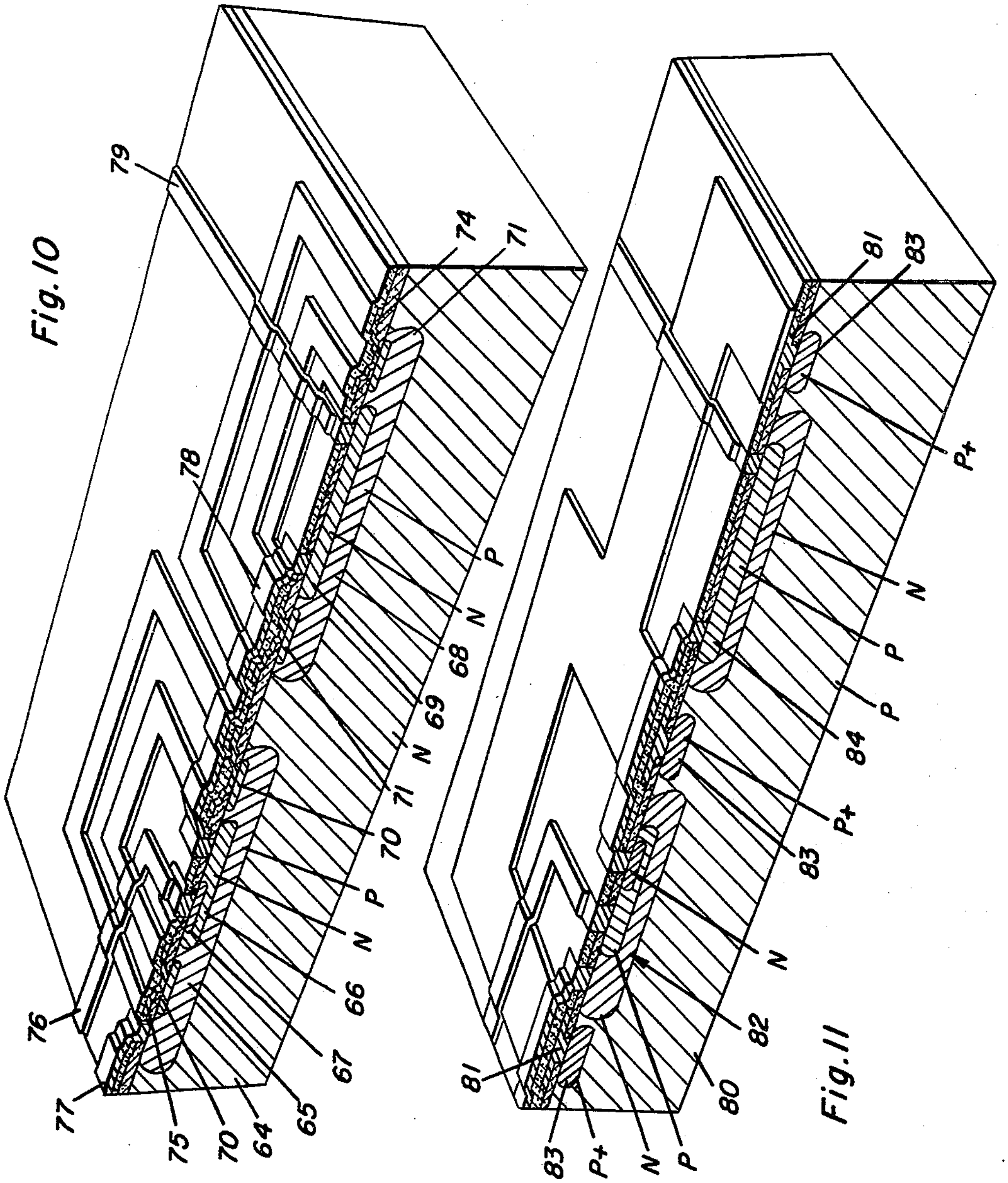
FIGURES 10, 11, 12 and 13 are pictorial views in section of other embodiments of the invention.

The field relief electrode of this invention may be utilized in a semiconductor integrated circuit device of the type illustrated in FIGURE 10. This device comprises a wafer 64 of monocrystalline n-type silicon having a transistor and a resistor formed therein, the transistor including a p-type collector region 65, an n-type base region 66, and a p-type emitter region 67 while the resistor includes a p-type isolating region 68 and an n-type region 69 which forms the resistor itself. Of course, the same wafer would ordinarily include many more transistors and resistors, as well as other circuit components such as diodes and capacitors, only two components being shown to illustrate the principle. The transistor and resistor are electrically isolated from one another by p-n junction in the wafer, the collector region 65 being separated from the resistor 69 by three such junctions between regions 65, 64, 68 and 69. However, isolation between components, as well as isolation between a component and the wafer or substrate 64 which is usually grounded, can be lost by the formation of a surface inversion layer just as in the case of a transistor as discussed above. To reduce inversion, the p-type regions have formed therein annular heavily-doped p+ regions 70 and 71. This alone may prove to be inadequate, however, because of the expanded contacts and interconnections as will be discussed below. The wafer 64 has a silicon oxide coating 72 covering the top surface thereof, except where ohmic contacts are made, and this coating will be in various thicknesses due to the process used to form the transistor and resistor regions, i.e., successive depositions and diffusions with oxide masking. Annular openings are made in the oxide coating 72 over the p+ regions 70 and 71, and contact metal is selectively applied to form field relief electrodes 73 and 74. An oxide coating 75 is deposited over the field relief electrodes 73 and 74 to insulate these electrodes from the leads which cross over. This coating 75 is formed at a relatively low temperature by the oxidative deposition technique discussed above with reference to FIGURE 9. Openings are cut through both oxide layers 72 and 75 in the areas where contact is to be made, then metal is selectively applied over the oxide and in the openings to provide a conductive strip 76 for a connection to the transistor emitter, a strip 77 for the collector connection, a strip 78 for an interconnection between the transistor base and one end of the resistor 69, and a strip 79 for a connection to the other end of the resistor.

In operation of the device of FIGURE 10, several bias conditions could be present which would tend to destroy isolation between the components due to shorting through an inversion layer. For example, if the strip 78 is positive with respect to the substrate 64, there would be a tendency for the left end of the resistor 69 to short out to the substrate due to inversion beneath the strip were the electrode 74 not present. Likewise, under these conditions the base of the transistor may tend to short to the substrate. Also, if the lead 78 is positive with respect to the collector region 65 but negative with respect to the substrate, shorting would be in the other direction, i.e., from the substrate to the base region 66. For this reason, the field relief electrodes 73 and 74 extend in both directions from the point of contact with the silicon surface.

In an integrated circuit employing a p-type substrate 80 and n-p-n transistors as seen in FIGURE 11, a field relief electrode 81 would surround the collector region 82 over a heavily-doped annular region 83. This same electrode may surround other adjacent components such as a resistor 84. As above, conductive strips over pyrolytically deposited oxide make connections to the regions of the transistor and resistor, and interconnections between components.

Figures 12, 13:
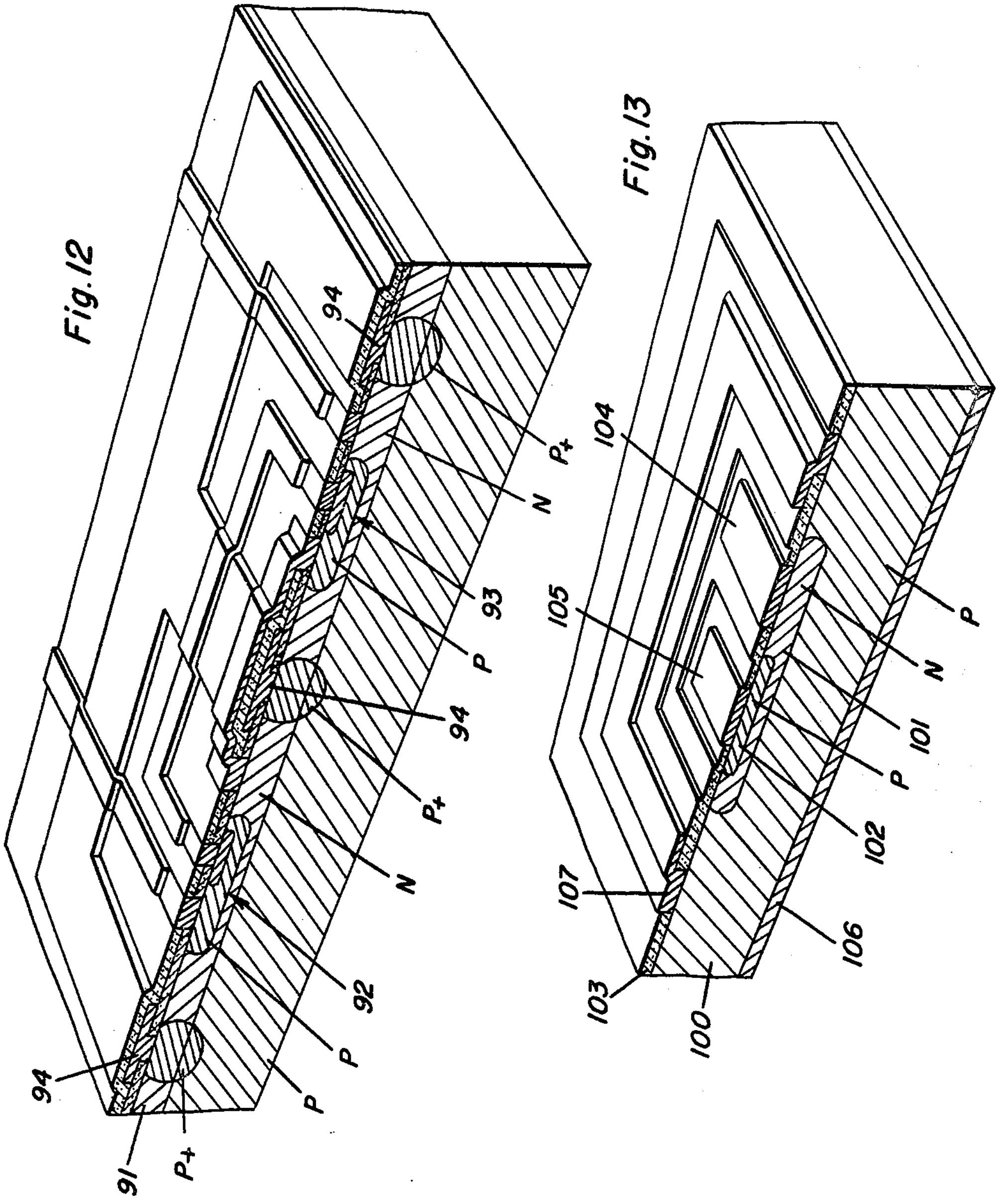

Many epitaxial type semiconductor devices employ a p-type substrate with an n-type epitaxial layer in which components are formed by diffusion. In an integrated circuit of this type, an example of which is illustrated in FIGURE 12, the n-type epitaxial layer 91 would function as the collector of n-p-n transistors 92 and 93, with the base and emitter being diffused therein. To isolate the collector regions of transistors 92 and 93 in the integrated circuit, a p+ isolation diffusion forms a grid of heavily-doped regions 94. Even though these regions are of high acceptor concentration, there is a possibility that the surface can invert to n-type under extreme operating conditions, thus destroying isolation between components. Thus, a field relief electrode 95 surrounds each component over the heavily-doped region 94. The field relief electrode 95 engages the silicon surface at the isolation regions 94, then extends over the thermal oxide coating in both directions, overlying part of the n-type region 91 so that inversion of the n-type material is also inhibited. The same inversion problem would occur in other epitaxial devices having expanded contacts, such as an epitaxial base transistor and an epitaxial channel field-effect transistor. In each case, a field relief electrode is added over the p+ isolation diffusion to prevent shorting due to surface inversion.

The field relief electrode of this invention is effective in reducing surface inversion due to electric fields, and may be used in some cases without the heavily-doped guard ring. Consider the transistor of FIGURE 3 without the heavy doping of the region 36 but with the electrode 43 in place. The area beneath the guard ring would be shielded from the electric field, and surface inversion would be substantially reduced.

A semiconductor device using conventional contacts of the nonexpanded type, i.e., not having conductive strips extending over junctions on top of an oxide coating, surface inversion apparently due to an electric field effect also occurs. Improved characteristics can be provided in such a device by the use of the field relief electrode of this invention. With reference to FIGURE 13 a p-n-p transistor is shown comprising a wafer 100 of p-type silicon forming the transistor collector, an n-type base region 101, and a p-type emitter region 102. An oxide coating 103 covers the top surface, and base and emitter contacts 104 and 105 are formed by metal deposited in openings in the oxide. A collector contact 106 engages the back surface of the wafer. When reverse bias is applied between the base and collector, contact 104 being positive with respect to contact 106, an electric field appears to be established vertically through the oxide layer 103 even though no metal strips extend over the oxide. It is believed that this effect is due to ionization of the upper surface of the oxide layer, permitting a positive charge to be built up as electrons flow to the positive contact 104. The surface of the p-type silicon underlying the oxide may be inverted by the corresponding concentration of electrons. This effect is increased with temperature. The oxide layer may become polarized, perhaps by migration of ions, so that the field and inversion layer remain after the reverse bias has been removed and the temperature lowered. The formation of an electric field, and the resultant inversion, may be prevented by the use of a field relief electrode 107 which surrounds the base region but is spaced therefrom. The electrode 107 makes ohmic contact to the surface of the p-type silicon of the collector region, then extends inwardly over top of the oxide layer 103. The presence of the metal electrode on the oxide surface prevents the build up of charge or field, underneath the metal at least, since this part of the top surface of the oxide is shorted to the underlying silicon. Thus a channel shorting the base contact to the collector cannot be completed.

The field relief electrode of this invention has utility in semiconductor devices other than the transistors, etc., illustrated above. For example, the reverse characteristics of a diode are distinctly improved by the use of this invention. The base-collector junctions of the transistors described herein may be considered as diodes, ignoring the emitters and emitter contacts.

Primary emphasis has been placed upon the use of the field relief electrode to avoid degradation due to inversion of p-type silicon since this appears to be the situation in which the effect is most troublesome. Inversion of n-type silicon also occurs, however, and so it will be understood that the principles of the invention apply equally well to n-p-n transistors or the like corresponding in structure to the p-n-p devices shown. It may be noted that lightly doped n-type silicon exhibits the inversion effect rather noticeably, but in fairly doped n-type silicon inversion is not ordinarily detected. Consider the transistor of FIGURE 3, but with the collector regions 31 and 32, and the emitter region 34 being n-type and the base region 33 being p-type. Here the guard ring 36 would be n+ rather than p+. Biasing the base negative with respect to the collector will produce a field beneath the strip 39 which tends to place a positive charge adjacent the silicon surface, thus tending to invert the surface of the n-type collector to p-type. The electrode 43 will prevent this from occurring by eliminating the field just as in the p-n-p arrangement.

Devices constructed using semiconductor materials other than silicon, such as germanium or the III–V compounds, may utilize this invention to advantage in some cases. Silicon has been used as an example because the inversion effect appears most prevalent in this material.

Although the invention has been described with reference to particular embodiments thereof, these embodiments are merely illustrative of the principles involved and are not to be construed in a limiting sense. Upon reading this description, various modifications of the disclosed embodiments, as well as other embodiments of the invention, will occur to persons skilled in the art.

What is claimed is:

1. In a semiconductor device of the type having a lightly-doped p-type region adjacent a surface thereof with a heavily-doped p-type region contiguous thereto, and having a conductive strip extending across said regions but spaced therefrom by an insulating layer, an electrode engaging the heavily-doped p-type region and extending therefrom over a portion of the lightly-doped p-type region beneath the conductive strip, the electrode being electrically insulated from the conductive strip and being spaced from the lightly-doped p-type region, and said conductive strip being ohmically connected to an N-type portion of said surface.

2. A p-n-p silicon planar transistor comprising a water of monocrystalline silicon, a p-type collector region defined in the wafer and extending to one face thereof, an n-type base region defined in said one face of the wafer and occupying only a limited part of the total area thereof, a p-type emitter region defined in said one face overlying the base region, a silicon oxide coating over said one face, a conductive electrode surrounding the base region on said one face but spaced from the base region, the electrode including a contact portion engaging the collector region in an opening in the oxide coating, the contact portion being in a closed configuration, the electrode further including a shield portion extending transverse to the contact portion over the oxide coating along the entire length of the electrode, an insulating layer on said one face over the electrode and over the oxide coating, and conductive strips overlying the insulating coating and extending across said electrode to make separate electrical connection to the base and emitter regions.

3. A p-n-p silicon planar transistor comprising a wafer of monocrystalline silicon, a p-type collector region defined in the wafer and extending to one face thereof, an n-type base region defined in said one face of the wafer and occupying only a limited part of the total area thereof, a p-type emitter region defined in said one face overlying the base region, a first silicon oxide coating over said one face, a heavily-doped guard ring region defined in the collector region adjacent said one face surrounding the base region but spaced therefrom, a field relief electrode surrounding the base region on said one face but spaced from the base region, the electrode including a contact portion engaging the guard ring region in an opening in the first oxide coating, the contact portion being in a closed configuration, the electrode further including a shield portion extending inwardly from the contact portion over the first oxide coating around the length of the electrode, a second oxide coating on said one face over the electrode and over the first oxide coating, and conductive strips overlying the second oxide coating and extending across said electrode to make separate electrical connection to the base and emitter regions.

4. A semiconductor device comprising a semiconductor wafer having a first region of one conductivity type extending to one face thereof, a second region of opposite conductivity type contiguous with said first region and forming therewith a first PN junction terminating at said one face, a third region of said one conductivity type contiguous with said second region and forming therewith a second PN junction terminating at said one face and surrounding said first PN junction thereat, insulating material on said one face of said wafer, a first conductor ohmically connected to said first region through an aperture in said insulating material and extending over said insulating material across a portion of said first PN junction, a second conductor ohmically connected to said second region through an aperture in said insulating material and extending over said insulating material across a portion of said second PN junction, a conductive member surrounding said second region on said one face and spaced therefrom, said member including a contact portion engaging said third region at said one face in a closed configuration and including a shield portion extending traversely of said contact portion along the entire length of said member, said shield portion overlying said insulating material and terminating outside of said second region, and a third conductor ohmically connected to said third region, said first and second conductors overlying part of said shield portion and being electrically insulated therefrom.

5. A semiconductor device comprising a semiconductor wafer having a lightly doped region of one conductivity type extending to a surface thereof, a heavily doped region of said one conductivity type in said lightly doped region and extending to said surface, a region of opposite conductivity type contiguous with said lightly doped region defining a PN junction therewith terminating at said surface and being spaced from said heavily doped region, insulating material on said surface, a conductive strip ohmically connected to said region of opposite conductivity type through an aperture in said insulating material, said conductive strip overlying said insulating material and extending across a part of said PN junction, said lightly doped region and said heavily doped region, a conductive member surrounding said region of opposite conductivity type on said surface, said member including a contact portion engaging said heavily doped region in a closed configuration and including a shield portion extending traversely from said contact portion around the entire member, said shield portion being spaced from said surface, overlying a portion of said lightly doped region and terminating outside of said region of opposite conductivity type, and said conductive strip overlying a part of said shield portion and being electrically insulated therefrom.

References Cited

UNITED STATES PATENTS

| | | | |
|---|---|---|---|
| 3,097,308 | 7/1963 | Wallmark | 317—235 |
| 3,109,942 | 11/1963 | Luscher | 317—235 |
| 3,197,681 | 7/1965 | Broussard | 317—235 |
| 3,226,612 | 12/1965 | Haenichen | 317—235 |
| 3,226,613 | 12/1965 | Haenichen | 317—235 |
| 3,275,910 | 9/1966 | Phillips | 317—235 |
| 3,292,240 | 12/1966 | McNutt et al. | 317—235 |
| 3,302,076 | 1/1967 | Kang et al. | 317—235 |

FOREIGN PATENTS 1,361,215 4/1964 France.

OTHER REFERENCES

IBM Technical Disclosure Bulletin, "Integrated Circuit Package," by Schwartz, May 1961, vol. 3, No. 12, pp. 26, 27.

Motorola Monitor, "Passive Elements," vol. 2, No. 2, June 1964, pp. 15 and 16.

JERRY D. CRAIG, Primary Examiner

U.S. Cl. X.R.

148—187